United States Patent [19]

Gontowski

[11] Patent Number: 4,916,332
[45] Date of Patent: Apr. 10, 1990

[54] TIMING AND SUPPLY BIAS CIRCUIT USING ONE CAPACITOR

[75] Inventor: Walter S. Gontowski, Thompson, Conn.

[73] Assignee: Cherry Semiconductor Corporation, East Greenwich, R.I.

[21] Appl. No.: 326,895

[22] Filed: Mar. 21, 1989

Related U.S. Application Data

[63] Continuation-in-part of Ser. No. 152,679, Feb. 5, 1988, abandoned.

[51] Int. Cl.$^4$ .......................... H03K 3/01; H03K 5/13
[52] U.S. Cl. .............................. 307/296.4; 307/296.6; 307/296.3; 307/592; 307/543
[58] Field of Search ............... 307/592, 596, 591, 542, 307/543, 546, 549, 552, 562, 296.4, 296.3, 296.1, 296.6

[56] References Cited

U.S. PATENT DOCUMENTS

| | | | |
|---|---|---|---|
| 3,894,247 | 7/1975 | De Jong | 307/297 |
| 3,965,666 | 7/1976 | Williams | 307/297 |
| 4,536,667 | 8/1985 | Masuda | 307/296 R |

OTHER PUBLICATIONS

"Pulsing a PROM's Supply Voltage Greatly Reduces the Energy Used", Electronic Design, 8-17, vol. 25, Peter Ernest.

Primary Examiner—Stanley D. Miller
Assistant Examiner—Richard Roseen
Attorney, Agent, or Firm—Robert M. Asher

[57] ABSTRACT

A supply bias circuit in which supply current is provided through a resistor coupled to a timing circuit such that this resistor acts as a low pass filter in conjunction with the timing capacitor. Supply current is passed from the timing current through a second resistor and into logic circuitry. The logic circuitry is further connected to the timing circuitry so that it receives extra current each time the capacitor discharges.

15 Claims, 1 Drawing Sheet

TIMING AND SUPPLY BIAS CIRCUIT USING ONE CAPACITOR

This is a continuation-in-part of co-pending U.S. application Ser. No. 07/152,679, filed Feb. 5, 1988 now abandoned.

BACKGROUND OF THE INVENTION

This invention relates to integrated circuits which provide timing and supply bias to logic circuitry.

It is often required to utilize integrated circuits in applications where the operating supply for the circuit contains a great deal of noise and electrical transients. This is especially true of the automotive environment where sensitive electronic circuitry has to function properly on the same supply lines with electrical spike producing elements such as relays, solenoids, etc.

It is normal practice to filter the supply line with a low pass filter consisting of a series resistor and a shunt capacitor to eliminate the effects of these transients. This, of course, adds additional cost to the electronic function. If one considers the increasing numbers of electronic functions appearing in the modern automobile, multiplied by the millions of automobiles manufactured annually, it is seen that the addition of one capacitor becomes a significant cost factor.

The objective of this invention is to eliminate the need for this capacitor by utilizing a capacitor already required in the timing section, to serve a second function as a power supply bias filter capacitor.

FIG. 1 is a simplified block diagram of a circuit of the prior art. The timing function of the circuit is provided by an oscillator formed by a comparator 10, a switching transistor 53 and a timing capacitor 14. The comparator 10 has an input 51 connected to a terminal 12 and a second input 55 connected to receive a reference signal from a conventional switched hysteresis circuit. The reference signal thus alternates between a lower threshold and an upper threshold. The terminal 12 is provided for connection to the timing capacitor 14. A switching transistor 16 is controlled by the comparator 10 to charge and discharge the capacitor 14 thereby generating a clock signal at the output of the comparator 10. The timing capacitor 14 is repeatedly charged through a resistor 18 until it reaches the upper threshold and is discharged through the switching transistor 16.

This circuit also includes logic circuitry 20. A commonly used technology for the logic circuitry is known as I²L. This logic is modelled in the schematic as a diode 20. The logic may perform any number of different electronic functions, but the particulars of the logic circuit are not relevent to this invention. The invention is essentially concerned with supplying the necessary bias currents and voltages to whatever logic circuitry is being represented by the diode 20. The logic circuits may consist of a string of flip-flops acting a counters that are clocked by the oscillator clock signal. Current for operating the logic circuitry is provided through a resistor 22.

The supply of current for the timer and logic circuitry of this circuit is provided through a supply pin 24. A regulator 26 receives the supply from the pin 24 and provides current to the timer, the logic circuitry and any other remaining support circuitry on the integrated circuit. The supply pin 24 is connected to a voltage source 28 such as a battery via a low pass filter formed by a resistor 30 and a capacitor 32. In this prior art design, the capacitor 32 ensures that under transient conditions, where the battery supply may momentarily drop, current is still available to prevent loss of the logic circuitry's memory state. It is an object of the present invention to provide such an integrated circuit which does not require the capacitor 32.

The remaining components in FIG. 1 including the resistor 34 and the current mirrors formed by diode 36, transistor 38 and transistor 40 are merely shown to demonstrate that additional circuitry may be included in the integrated circuit which receive power from the regulator 26.

SUMMARY OF THE INVENTION

This invention is directed to a supply bias circuit for logic circuitry including a supply pin for providing a source voltage to the integrated circuit. A timing circuit is provided within the integrated circuit with a terminal for connection to a capacitor. The timing circuit may be an oscillator or a one shot or other commonly used timer. The timing circuit generates a clock signal b charging and discharging the capacitor. A resistor path is provided for supplying current from the supply to the timing circuit. The logic circuitry is advantageously provided current through a resistor path leading from the timing circuit. In this manner, the resistor path into the timing circuit forms a low pass filter with the capacitor of the timing circuit. Thus, in accordance with the present invention the capacitor connected to the timing circuit performs two functions, that of a timing capacitor and that of a low pass filter to prevent transient signals from shutting off the current to the logic circuitry.

A further advantage of the present invention is that the logic circuitry receives extra current when the capacitor is discharging. Supply of this extra current advantageously coincides with a change of state in the logic circuitry which is when the logic circuitry needs more current. By providing extra current when it is needed, the present invention permits the integrated circuit to be run at lower power.

Other objects and advantages of the present invention will become apparent during the following description of the presently preferred embodiment of the invention taken in conjunction with the drawings.

DETAILED DESCRIPTION OF THE PREFERRED EMBODIMENT

Figure 1:
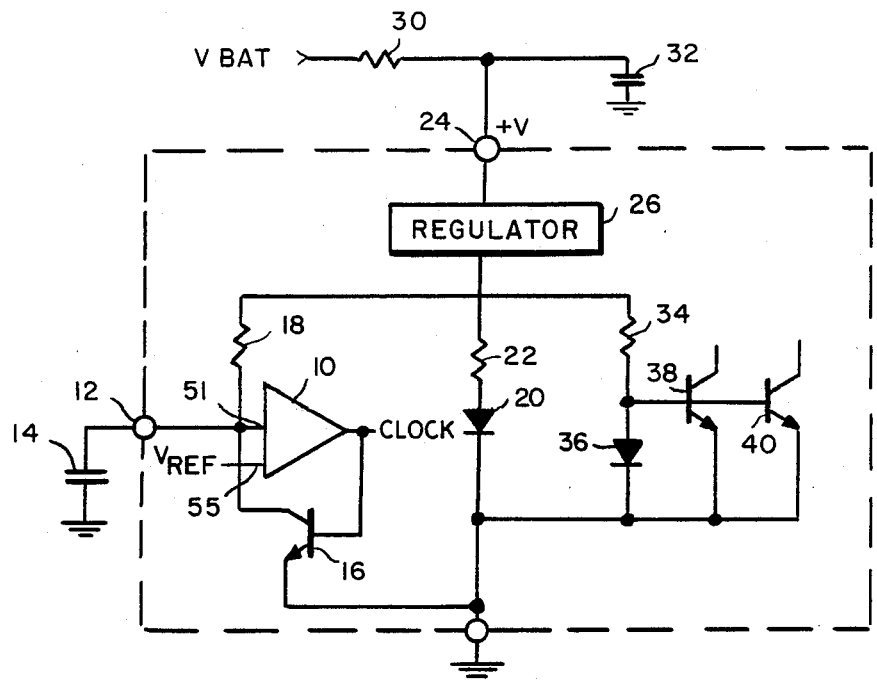
FIG. 1 is a schematic block diagram of a circuit of the prior art.
Figure 2:
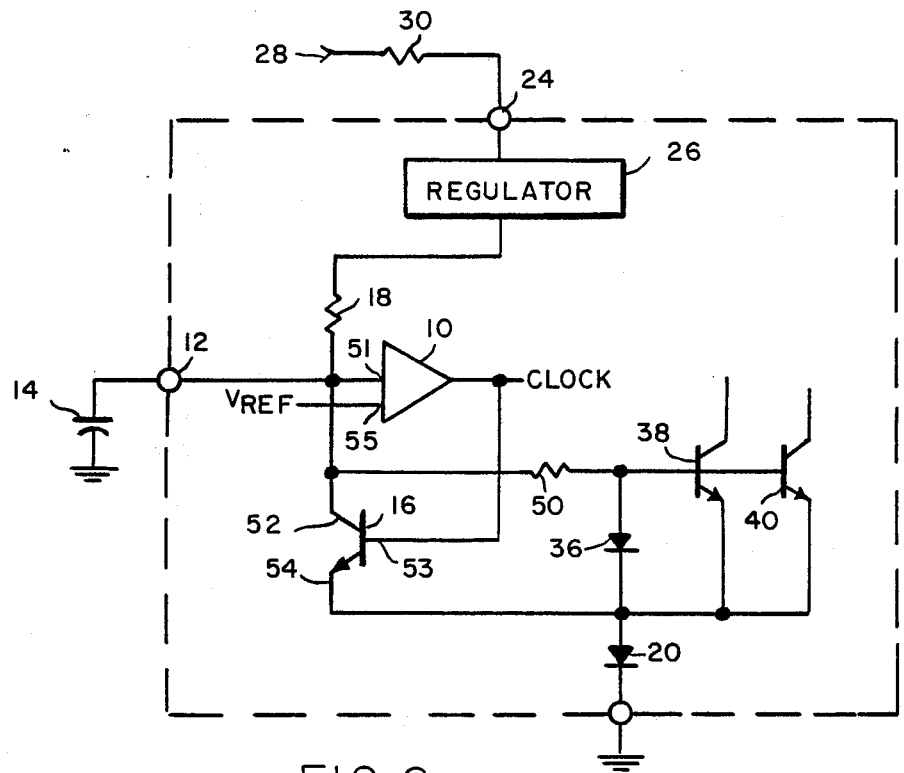
FIG. 2 is a schematic block diagram of the supply bias circuit of the present invention.

Referring now to FIG. 2, a block diagram of the circuit of the present invention is shown. As in the prior art, timing is provided by an oscillator formed by a comparator 10, a switching transistor 16 and a capacitor 14. The comparator 10 has an input 51 coupled to a terminal 12. The terminal 12 connects to the capacitor 14. The second input 55 into the comparator receives the switched hysteresis reference signal which alternates between a lower threshold and an upper threshold. In accordance with the presently preferred embodiment, the lower threshold voltage is 2 volts and the upper threshold voltage is 3 volts.

The switching transistor 16 includes an input terminal 52, a control terminal 53 and an output terminal 54. The input terminal 52 of the switching transistor 16 is coupled to the input of the comparator 10. The comparator 10 controls the switching transistor 16 through the control terminal 53 so as to alternately charge and discharge the capacitor 14. The comparator 10 and timing capacitor 14 thus provide a clock signal at the output of the comparator. The clock signal is used to provide the timing for the logic circuitry 20.

Current for charging the capacitor 14 is provided through a resistor 18 which couples the regulator 26 to the terminal 12. The regulator 26 is connected to the supply pin 24 which is coupled to the voltage source 28 through a resistor 30. The present invention avoids the need for a capacitor at the power supply pin 24. The arrangement of the present circuit advantageously configures capacitor 14 and resistor 18 as a low pass filter to thereby prevent transient signals from causing current to be shut off to the logic circuitry 20. Thus, in the circuit of the present invention the capacitor 14 serves a dual function. It serves as the timing capacitor and it serves as a supply filter.

In accordance with the present invention, a resistor 50 is connected to the first input 51 of the comparator 1 for receiving supply current from the regulator 26 through the resistor 18. The resistor 50 provides the current to the logic circuitry 20. In the preferred embodiment of FIG. 2, the current passes through a diode 36 and then into the logic circuitry 20. While the current provided through the logic circuitry 20 will now vary as the capacitor 14 is charged and discharged between 2 and 3 volts, this does not harm the operation of the logic circuitry. The logic circuitry 20 will operate properly as long as it is receiving a minimum amount of current for its operation. The current through resistor 18 is sufficient to charge capacitor 14 and to power the logic circuitry. Additional transistors 38 and 40 are shown in the diagram to indicate that additional circuitry may be provided in the integrated circuit. Transistors 38 and 40 mirror the current provided through diode 36.

Further in accordance with the present invention, the logic circuitry 20 is connected to the output terminal 54 of the switching transistor 16 so as to receive additional current through the switching transistor 16 when the capacitor 14 is discharging. The logic circuitry 20 is a digital circuitry which switches between a 0 state and a 1 state. Supply current in this digital logic circuitry is primarily required when the circuitry is changing state from a 1 to a 0 or a 0 to a 1. Such a change in state will always occur coincidently with the discharging of the capacitor 14 in accordance with conventional usage in which the timing circuit provides a clock signal which is twice as fast or another integral multiple as fast as the switching frequency of the logic circuitry. By providing a significant boost in the current when it is most needed, at a state change, the circuit of the present invention can run with lower power consumption than the prior art circuit. The prior art would need to always provide the maximum current required during a state change. The present invention can operate with a minimum supply of current since it is regularly supplemented at the critical switching moments by the discharge of capacitor 14.

It is noted that any transient appearing on the supply line are effectively suppressed by the low pass filter formed by capacitor 14 and resistor 18. In addition, the boost of current provided by switching transistor 16 when the capacitor 14 discharges, advantageously increases the switching speed of the logic circuitry 20.

Of course, it should be understood that various changes and modifications to the preferred embodiment described above will be apparent to those skilled in the art. Such changes can be made without departing from the spirit and scope of the invention, and without diminishing its attendant advantages. It is therefore intended that such changes and modifications be covered by the following claims.

I claim:

1. A supply bias circuit for logic circuitry comprising:
   supply means for receiving a source voltage;
   terminal means for connecting to a capacitor;
   timing means, having an input coupled to said terminal means, for controlling at what time said capacitor is charged and discharged;
   first resistor means, coupled between said supply means and said terminal means, for receiving supply current from said supply means and for forming with said capacitor a low pass filter to prevent transient signals from shutting off the current to said logic circuitry; and
   second resistor means, coupled to said first resistor means, for providing current received from said first resistor means to said logic circuitry.

2. The circuit of claim 1 wherein said timing means comprises a comparator having a second input connected to receive a reference signal which alternates between a lower threshold and an upper threshold.

3. The circuit of claim 1 wherein said logic circuitry is coupled to said timing means such that when said capacitor discharges, extra current is fed into said logic circuitry.

4. The circuit of claim 1 wherein said supply means further includes means for regulating said source voltage.

5. The circuit of claim 1 further comprising a diode connected between said second resistor means and said logic circuitry, said diode providing a path for current from said second resistor means into said logic circuitry.

6. The circuit of claim 5 further comprising a plurality of transistors connected in parallel with said diode so as to mirror the current passing through said diode.

7. A supply bias circuit for logic circuitry comprising:
   supply means for receiving a source voltage;
   terminal means for connecting to a capacitor;
   a switching transistor having an input terminal, and a control terminal;
   comparator means, having an input coupled to said terminal means and the input terminal of said switching transistor and having an output coupled to the control terminal of said switching transistor, for turning said switching transistor off and on to charge and discharge said capacitor;
   first resistor means coupled between said supply means and said terminal means, for receiving supply current from said supply means and for forming with said capacitor a low pass filter to prevent transient signals from shutting off the current to said logic circuitry; and
   second resistor means, coupled to said first resistor means, for providing current received from said first resistor means to said logic circuitry.

8. The circuit of claim 7 wherein said logic circuitry is coupled to an output terminal of said switching transistor such that when said capacitor discharges, extra current is fed into said logic circuitry.

9. The circuit of claim 7 wherein said supply means further includes means for regulating said source voltage.

10. The circuit of claim 7 further comprising a diode connected between said second resistor means and said logic circuitry, said diode providing a path for current from said second resistor means into said logic circuitry.

11. The circuit of claim 10 further comprising a plurality of transistors connected in parallel with said diode so as to mirror the current passing through said diode.

12. A supply bias circuit for logic circuitry comprising:
   supply means for receiving a source voltage;
   terminal means for connecting to a capacitor;
   a switching transistor having an input terminal, an output terminal and a control terminal;
   comparator means, having an input coupled to said terminal means and the input terminal of said switching transistor and having an output coupled to the control terminal of said switching transistor, for turning said switching transistor off and on to charge and discharge said capacitor;
   first resistor means, coupled between said supply means and said terminal means, for receiving supply current from said supply means; and
   said logic circuitry being coupled to the output terminal of said switching transistor such that when said capacitor discharges, discharge current is fed into said logic circuitry.

13. The circuit of claim 12 wherein said supply means further includes means for regulating said source voltage.

14. The circuit of claim 12 further comprising a diode coupled between said input of said comparator and said logic circuitry, said diode providing a path for current from said input of said comparator into said logic circuitry.

15. The circuit of claim 14 further comprising a plurality of transistors connected in parallel with said diode so as to mirror the current passing through said diode.

* * * * *